United States Patent [19]

Goffredo et al.

[11] 3,801,387

[45] Apr. 2, 1974

[54] ETCHANT REMOVER APPARATUS AND METHOD

[75] Inventors: Daniel L. Goffredo, Riverton, N.J.; Conrad Dale Shakley, Spring Mills, Pa.

[73] Assignee: Chemcut Corporation, State College, Pa.

[22] Filed: Oct. 18, 1971

[21] Appl. No.: 189,895

[52] U.S. Cl. .......................... 156/2, 15/302, 134/37, 134/198, 156/8, 156/18, 156/19

[51] Int. Cl. .......................... B08b 3/02, B08b 7/04

[58] Field of Search .............. 156/345, 2, 8, 18, 19; 134/15, 1, 10, 37, 42, 64, 82, 93, 198; 15/302

[56] References Cited

UNITED STATES PATENTS

| | | | |
|---|---|---|---|
| 2,566,142 | 8/1951 | Powers | 15/302 X |
| 2,967,119 | 1/1961 | Gutterman | 134/1 |
| 3,034,933 | 5/1962 | Richards | 134/28 |

*Primary Examiner*—William A. Powell

*Attorney, Agent, or Firm*—Paul & Paul

[57] ABSTRACT

Treated articles such as printed circuit boards that have been etched with an etchant or treated with a solvent, are delivered into a zone of sufficiently high humidity to prevent drying of a liquid treatment fluid on the articles, and wherein the treatment fluid is "blown off" the articles by pressurized air, in the high humidity environment, with the treatment fluid then being delivered for re-use at a prior station.

12 Claims, 4 Drawing Figures

ETCHANT REMOVER APPARATUS AND METHOD

BACKGROUND OF THE INVENTION

In the art of etching printed circuit boards, the boards are generally masked, to prevent etching of copper portions thereof, with unmasked portions of the board having copper portions etched by an acid, such as ferric chloride or the like. For purposes of this invention, such acid may be referred to as "treatment fluid," and is in the liquid state. Such acid has in the past been rinsed from the board following an etching operation, thereby contaminating the rinse water, requiring regular discharge of the rinse water, carrying the acid to sewage, and eventually to waterways and the like and thereby contaminating the environment. Furthermore, the etchant or treatment fluid is lost, and not available for re-use, unless an expensive reclamation process is utilized. In any event, prior art techniques have involved substantial expense, either by necessitating the loss of the etchant after use, or necessitating the utilization of expensive reclamation equipment.

Furthermore, in the art of printed circuit board manufacture, the mask or "resist," applied to the printed circuit boards must be removed in a subsequent operation. Such removal is generally effected by the use of a solvent, generally of the alkaline type, for removal of resist of the soluble silkscreen ink or photoresist type, when the resist is of the acid type. Accordingly, the term "treatment fluid" is intended also to encompass solvents and alkaline solutions.

As in the past, following application of etchant to printed circuit boards, water sprays are generally used to remove solvent that remains on the boards following a solvent stripping operation, such water sprays also contaminating sewage, waterways and the like, and furthermore requiring either loss of the solvent or other treatment fluid, or else requiring expensive equipment for reclamation of the same.

SUMMARY OF THE INVENTION

The present invention is directed toward providing a device for utilization either between an etching chamber and a rinsing section, or between a resist stripping station and a subsequent rinsing station associated therewith, in order to physically remove the treatment fluid, be it an etchant, or a solvent or the like, physically from the printed circuit boards, prior to spraying the boards with any fluid that would tend of dilute such treatment fluid.

Accordingly, the present invention is directed toward providing a means whereby articles such as printed circuit boards may have the treatment fluid physically blown therefrom, by jets or streams of gas such as air, or the like, in an environment of sufficiently high humidity that the treatment fluid will not dry on the boards, or evaporate therefrom, and preferably for reclamation of such treatment fluid by collecting the same and redelivering the treatment fluid to the zone or equipment from which it came, be it etching equipment, or resist stripping equipment, for re-use.

Accordingly, it is an object of this invention to provide a novel apparatus for removing liquid treatment fluid from articles that have been treated, without substantial dilution of the liquid treatment fluid.

It is another object to accomplish the above object wherein the liquid treatment fluid is removed from the articles by blowing the same therefrom.

It is a further object to accomplish the object immediately above in a moist atmosphere to prevent drying of the liquid treatment fluid on the articles being treated.

It is a further object of this invention to provide novel method steps and apparatus for accomplishing the objects set forth above, and others as will be apparent more fully hereinafter.

Other objects and advantages of the present invention will be readily apparent to those skilled in the art from a reading of the following brief descriptions of the drawing figures, detailed description of the preferred embodiment, and the appended claims.

IN THE DRAWINGS

Figure 1:
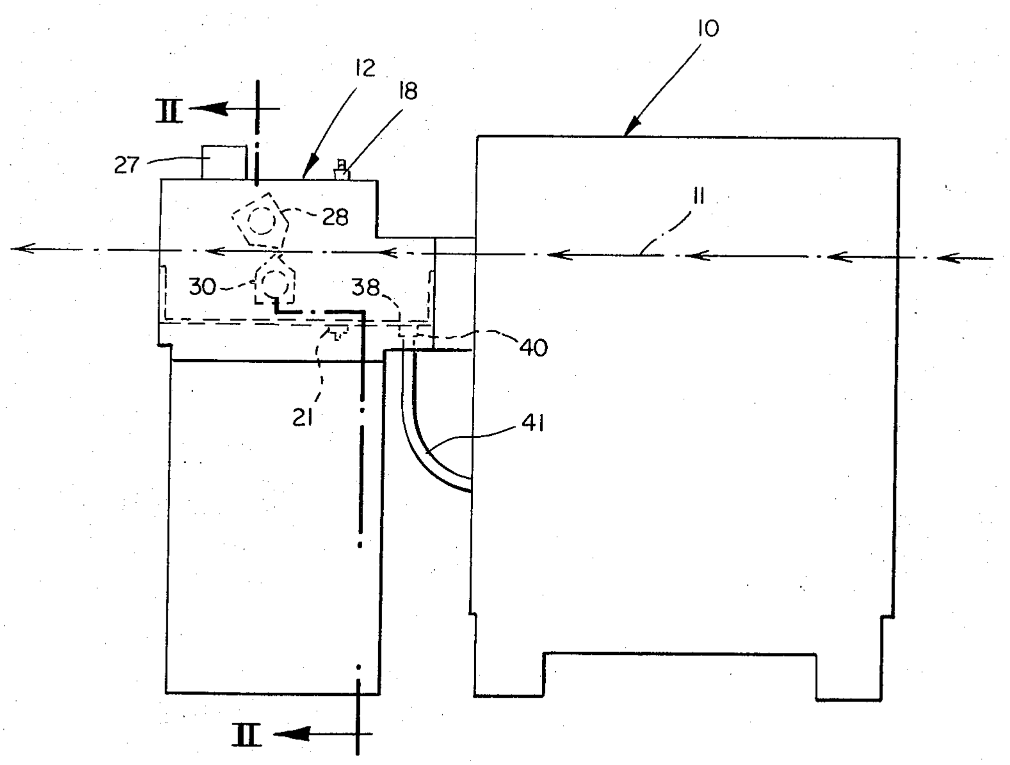
FIG. 1 is a side elevational view of a treatment station with a treatment fluid removal station disposed next thereto, in accordance with this invention, with several components in the latter station being illustrated in dotted lines, for the sake of clarity.

Referring now to the drawings in detail, reference is first made to FIG. 1, wherein there is illustrated a treatment liquid application station, generally designated by the numeral 10, that may comprise an etching station wherein acid is applied to copper surface portions of printed circuit boards or the like, or with the station 10 comprising a solvent application station or the like for removal of resist, or mask from printed circuit boards or the like. Throughout this application, it will be understood, that wherever the apparatus 10 is referred to as being an etching station, that the same could also be a solvent application station as aforesaid.

Disposed adjacent the station 10, but downstream thereof, as viewed in the direction of flow of a printed circuit board being conveyed as illustrated by the arrow 11, there is provided the removal station 12 of this invention.

Figure 2:
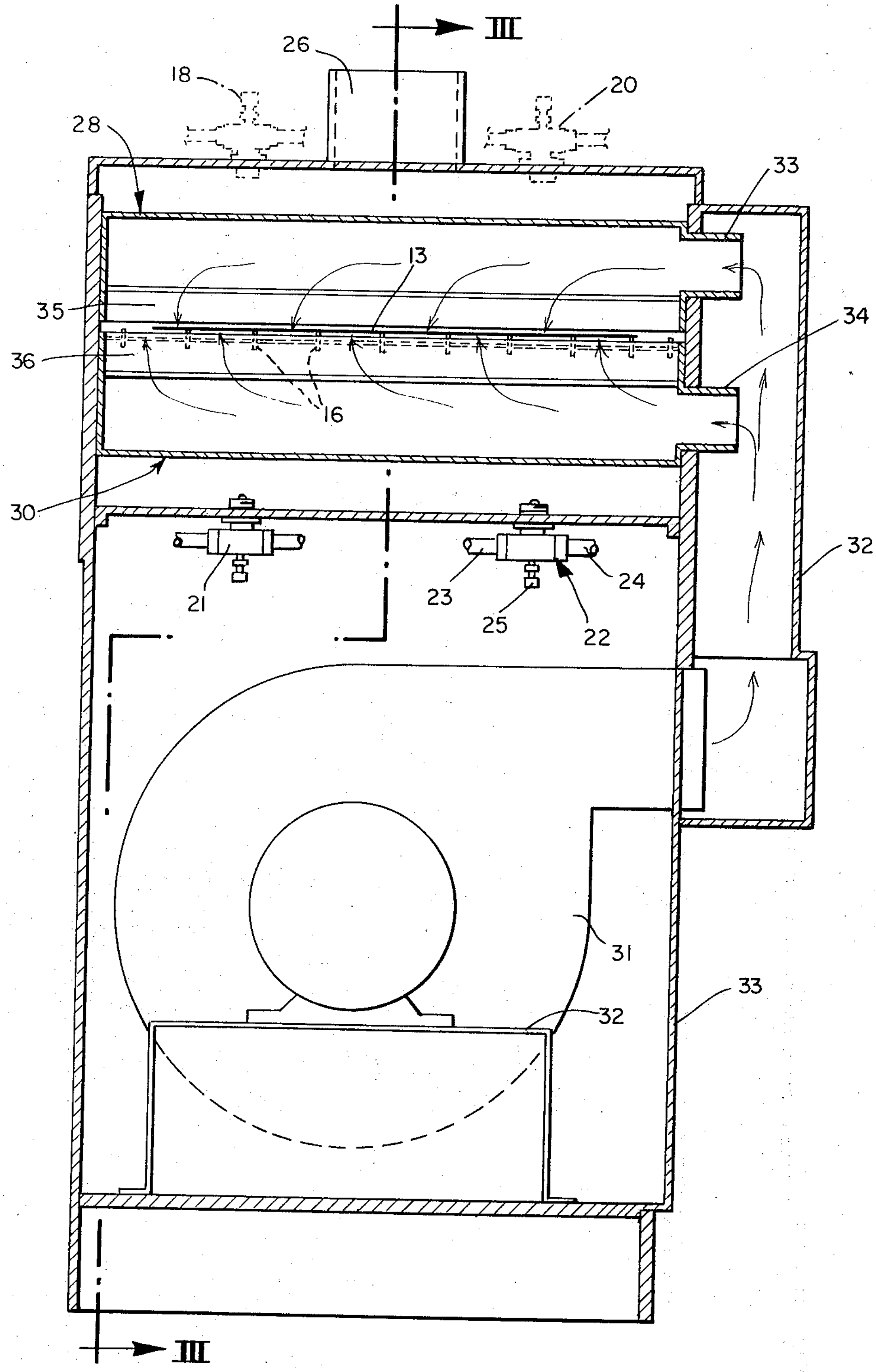
FIG. 2 is an enlarged transverse sectional view, taken through the treatment fluid removal station of FIG. 1, generally along the line II—II of FIG. 1, and wherein the air distribution for facilitating the "blow-off" of liquid treatment fluid is more clearly illustrated, and with spray nozzles for creating the high humidity atmosphere being also illustrated.
Figure 3:
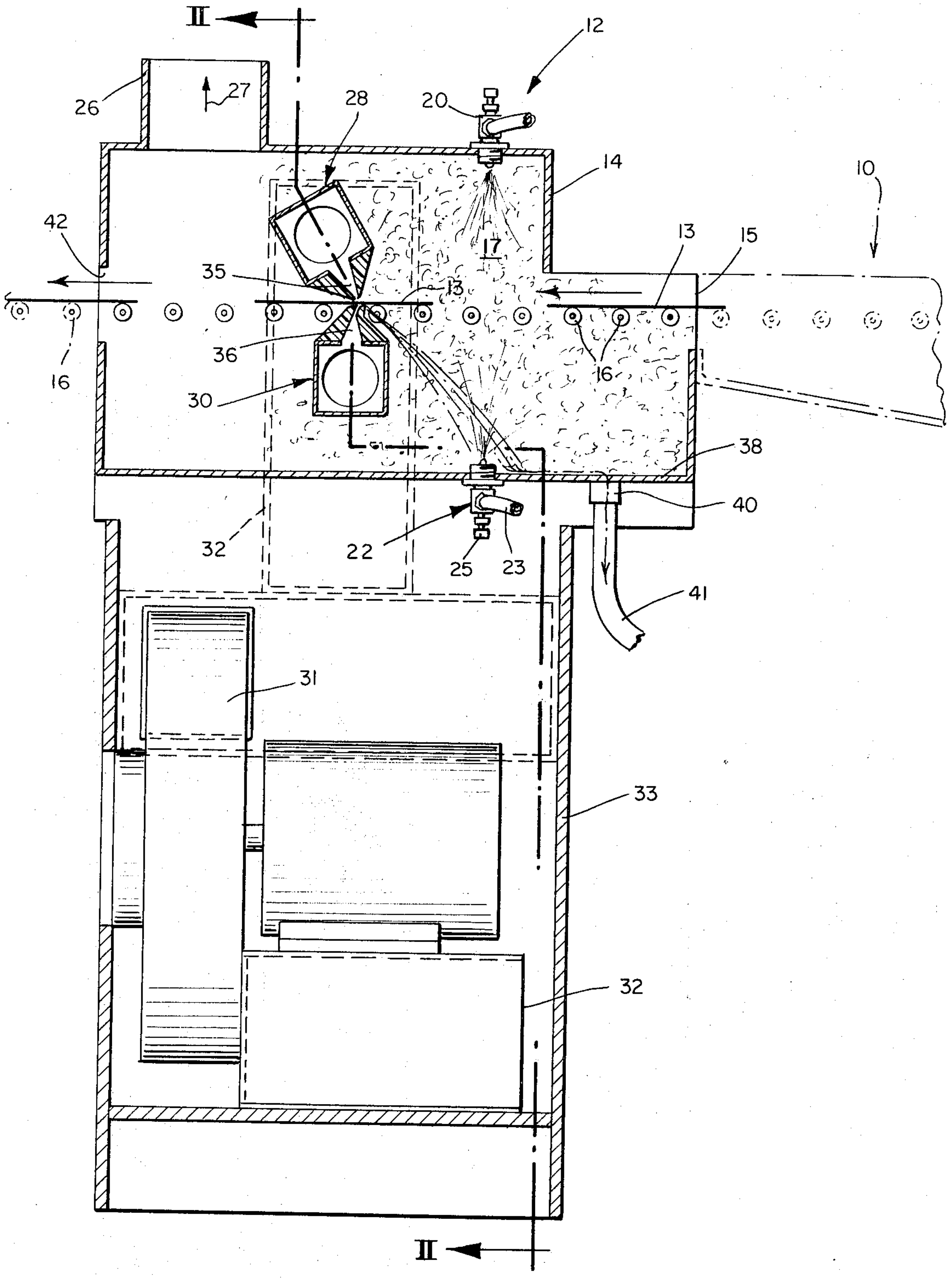
FIG. 3 is a longitudinal sectional view, taken through the apparatus of FIG. 2, generally along the line III—III of FIG. 2, and wherein the function of the various operative components of the treatment liquid removal apparatus of this invention are more clearly apparent.

With particular reference to FIGS. 2 and 3, it will be apparent that printed circuit boards 13 are delivered to the station 12, passing inwardly of a chamber 14 thereof, through an opening 15, and being carried along a predetermined generally horizontal path by a plurality of driven drive wheels 16, which are driven for rotation in a counterclockwise direction, as viewed in FIG. 3, for passage of the conveyor boards 13 from right to left as viewed in FIG. 3.

The boards 13 then pass through a fog zone 17, of moist air, of high relative humidity, preferably as close as possible to, but not exceeding 100 percent relative humidity. This is to prevent acid or other treatment liquid that is present on the boards 13 from evaporating, or drying on the boards. However, it will be noted that the fog or mist 17 should not surpass 100 percent relative humidity, in order to avoid formation of water droplets on the boards 13, that would dilute the liquid treatment fluid being removed therefrom. The fog or mist is created by emanation or spray of water under pressure from one or more nozzles 18, 20, 21 and 22, each of which is provided with a water inlet 23, a pressurized air inlet 24, and an adjustment device 25, for properly regulating the amount of moisture to be sprayed from an associated said nozzle. While four such spray nozzles 18, 20, 21 and 22 are utilized, it will be apparent that any number may be utilized that will perform the desired function. Accordingly, the nozzles create the high humidity atmosphere 17 within the chamber 14. It will be noted that such atmosphere does not pass rightward through the inlet 15 of the apparatus 12, because of a slight draft or partial vacuum applied at the left upper end of the chamber 14, to a duct 26, such draft amounting to a mere few pounds gauge pressure below atmospheric, in order to provide a direction of gentle flow for the fog 17, in order to prevent excessive buildup of moisture within the chamber 14. Accordingly, the flow of fog 17 is in the direction of the arrow 27.

As the boards 13 are delivered through the zone 17, they pass between streams of gas (preferably air) emanating from upper and lower air knives 28 and 30, for blowing off acid or other treatment liquid from upper and lower surfaces respectively of the boards 13.

Figure 4:
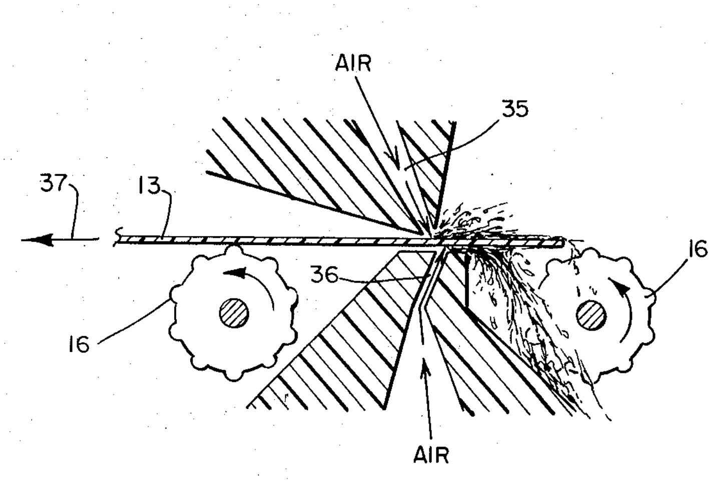
FIG. 4 is an enlarged fragmentary longitudinal sectional view illustrating the details of the air knife configurations utilized to effect the "blow-off."

The air knives 28 and 30 are provided with a gas such as pressurized air, by means of a motor driven blower 31, suitably mounted on a support 32 within a base 33 of the apparatus 12, for delivery of a stream of air from the blower 31, upwardly through delivery duct 32, in the direction of the arrows indicated in FIG. 2, for delivery through protruding ends 33 and 34 of the air knives 28 and 30, to be discharged through slit-like orifices 35 and 36, respectively, as is best illustrated in FIG. 4, with the air knives 28 and 30 being angularly oriented, or configured, or both, in order to facilitate a blowing-off of treatment liquid from the boards 13, in a rearwardly direction, relative to the forward direction of movement of the boards 13 indicated by the directional arrow 37, in FIG. 4, for example.

Acid or other treatment liquid thus blown from the boards 13 falls to the bottom wall 38 of the chamber 14, for discharge through a drain 40 thereof, for redelivery to the apparatus 10 through delivery line 41, for re-use as aforesaid.

Printed circuit boards 13 that have passed between air knives 28 and 30 are thus delivered by the rollers 16, through an outlet or discharge 42 of the chamber, generally to a rinsing station or apparatus, whereby rinsing of any residual treatment liquid may be effected, without introducing any substantial amount of treatment liquid into the rinse medium.

It will be apparent that various components of the apparatus of this invention will be constructed of selected materials that are especially selected to prevent deterioration of the same by acids, solvents or the like. Accordingly, utilization of materials such as titanium and various other acid-resistant materials such as plastics like polyvinylchloride or the like will be commonplace.

It will further be noted that the amount of water utilized in formation of the water mist 17 will be of sufficiently low volume to prevent significant dilution of the etchant or other treatment liquid. For example, the water may be atomized with compressed air delivered from an air line at five pounds per square inch gauge, at a flow of 3.2 cubic feet/minute. A typical water usage may require 0.75 gallons of water per hour. The air knives may be fed by a centrifugal blower that would be capable of delivering approximately 185 cubic feet/minute at a pressure of 7 ¼ inches of water. It will be noted that the moist atmosphere is often particularly necessary because the etchant may be heated to 130 degrees fahrenheit or more, that would otherwise stimulate a high rate of evaporation of water therefrom. Furthermore, other substances such as liquid kerosene or other solvents not miscible with the etchant may be utilized in lieu of water, for delivery to the nozzles, to make a fog or mist. As used herein, therefore the terms "humidity," "fog" and "mist" are not limited to water atmosphere, but can also be atmospheres of other liquids.

It has been found that the function of the apparatus 12 of this invention is highly desirable. In a system wherein printed circuit boards are delivered directly from an etcher, for example, to a rinsing station, without an apparatus of the type 12 of this invention, and with ferric chloride as an etchant, it has been found that, for a particular apparatus, at a conveyor speed of 50 inches per minute, an amount of etchant containing ferric chloride that was delivered to the rinsing station was 2.6 grams of iron per square foot of board, utilizing grams of iron per square foot of board as a measurement of the amount of etchant delivered to the rinsing station. However, when a unit of the type of this invention was inserted between the etching apparatus and the rinsing apparatus, only 0.02 grams of iron per square foot of board was delivered to the rinsing station, again using the iron content as a fair measurement of the amount of ferric chloride etchant that was delivered to the rinsing station. From this iron value, the copper content of the etchant can be computed because it would be proportionately equivalent to the copper content of the ferric chloride etchant. Thus, it will be apparent that there is approximately a reduction by a factor of 100 or more, in the amount of etchant remaining on the boards, as residue, with the utilization of the apparatus of this invention.

It will further be noted that the air knives 28 and 30 of this invention may take on any desired shapes or configurations, such as being completely cylindrical, rather than of the generally rectangular cross-section illustrated, as desired, and their placement and orientations may vary, as long as the streams of air emanating therefrom function to blow-off the treatment liquid, while the affected portions of the boards 13 are still within the high humidity environment. Also, it will be apparent that the air streams emanating through the openings 35 and 36 of the knives 28 and 30 may be continuous between opposite sidewalls of the chamber 14, or, if rigidity of the construction of the air knives 28 and 30 is a concern, a plurality of slits or holes of other types, may be utilized, across the apparatus 12, between sidewalls thereof.

Also, while printed circuit boards are identified as being the articles from which the treatment fluid is "blown-off," it will be apparent that other members, such as flexible printed circuits, or even members that are not printed circuits may employ the advantages of this invention.

It will be apparent from the foregoing that various modifications may be made in the details of construction, as well as in the use and operation of the apparatus of this invention, all within the spirit and scope of the appended claims.

What is claimed is:

1. Apparatus for removing liquid substances from articles following treatment of articles in a treatment zone with such substances as part of a treatment operation comprising a chamber for substantially containing a moist atmosphere, conveyor means for receiving articles therein with liquid substance to be removed therefrom and for conveying the articles along a path through said chamber in a forward direction, means for creating a sufficiently moist or humid atmosphere in said chamber to prevent evaporation of moisture from the liquid substance and substantial drying of the liquid substance on the articles, means for delivering a sufficiently forceful stream of gas to the liquid substance on articles in the moist atmosphere to blow the liquid substance therefrom in a general rearward direction relative to the forward direction of conveyance of the articles through the chamber.

2. The apparatus of claim 1, including means for collecting the liquid blown from articles for return of the liquid to the treatment zone.

3. The apparatus of claim 1, wherein said means for creating a moist atmosphere comprise means for creating a relative humidity of approximately 100 percent.

4. The apparatus of claim 1, wherein said means for creating a moist atmosphere comprise spray nozzles having means for connecting water and compressed air thereto.

5. The apparatus of claim 1, wherein said means for delivering a stream of gas comprise a pair of air knives disposed for delivering concentrated air streams substantially completely across the path of movement of articles through the chamber.

6. The apparatus of claim 5, wherein one air knife is disposed above the path of movement of articles through the chamber, and one air knife is disposed below the path of movement of articles through the chamber, and wherein said air knives are positioned for directing streams of air toward each other and in a general rearward direction.

7. The apparatus of claim 6, including blower means for supplying air to said air knives.

8. The apparatus of claim 7, including means for exhausting moist air from said chamber.

9. A method of rinse-free removing of liquid treatment fluid from treated articles comprising the steps of moving articles along predetermined paths, exposing the articles to a sufficiently high humidity environment in a chamber to prevent substantial drying of treatment fluid or evaporation of moisture of treatment fluid from the articles, blowing treatment fluid from surfaces of the articles by blowing a gas thereon while the articles are in the high humidity environment and while the articles are moving along their paths, and collecting treatment fluid thus blown from the articles.

10. The method of claim 9, including the step of returning the collected treatment fluid to a treatment station for re-use.

11. The method of claim 9, wherein the articles being treated are printed circuit members and the treatment fluid comprises an etchant, with liquid removing taking place immediately subsequent to an etching step.

12. The method of claim 9, wherein the articles being treated comprise printed circuit members and the treatment fluid comprises a solvent, with the liquid removing taking place immediately subsequent to dissolution of a coating from a printed circuit board by the solvent.

* * * * *